United States Patent
Pai

(10) Patent No.: US 11,081,861 B2
(45) Date of Patent: Aug. 3, 2021

(54) INCREASE VCSEL POWER USING MULTIPLE GAIN LAYERS

(71) Applicant: Mieng Pai, Bellingham, WA (US)

(72) Inventor: Mieng Pai, Bellingham, WA (US)

( * ) Notice: Subject to any disclaimer, the term of this patent is extended or adjusted under 35 U.S.C. 154(b) by 0 days.

(21) Appl. No.: 16/846,270

(22) Filed: Apr. 10, 2020

(65) Prior Publication Data

US 2020/0328574 A1 Oct. 15, 2020

Related U.S. Application Data

(60) Provisional application No. 62/831,756, filed on Apr. 10, 2019.

(51) Int. Cl.
| | |
|---|---|
| *H01S 5/00* | (2006.01) |
| *H01S 5/183* | (2006.01) |
| *H01S 5/20* | (2006.01) |
| *H01S 5/042* | (2006.01) |
| *H01S 5/42* | (2006.01) |
| *H01S 5/30* | (2006.01) |

(52) U.S. Cl.
CPC ...... *H01S 5/18397* (2013.01); *H01S 5/04256* (2019.08); *H01S 5/183* (2013.01); *H01S 5/1833* (2013.01); *H01S 5/2004* (2013.01); *H01S 5/2018* (2013.01); *H01S 5/426* (2013.01); *H01S 5/3054* (2013.01)

(58) Field of Classification Search
CPC ............. H01S 5/18397; H01S 5/04256; H01S 5/2004; H01S 5/1833; H01S 5/2018; H01S 5/183; H01S 5/426

See application file for complete search history.

(56) References Cited

U.S. PATENT DOCUMENTS

| | | | | |
|---|---|---|---|---|
| 5,633,527 | A * | 5/1997 | Lear ................... | G02B 6/12004 257/101 |
| 2003/0058911 | A1* | 3/2003 | Ebeling ................... | H01S 5/426 372/50.1 |
| 2004/0179566 | A1* | 9/2004 | El-Bahar ............. | H01S 5/34333 372/45.01 |
| 2016/0241000 | A1* | 8/2016 | Gronenborn .......... | H01S 5/0608 |

* cited by examiner

*Primary Examiner* — Kinam Park

(57) ABSTRACT

This invention opens up the chip thickness for increasing VCSEL power. It describes a method by using multiple gain layers 10, separated by insulating layers 11, powered in parallel electrically through embedded electrodes 13, 14 connected through via holes. The gain layers, as a whole, are bounded on top and bottom by DBR mirrors 12. The structure, compared to a standard VCSEL, leads to higher power, lower resistive loss, higher device speed, higher beam quality, and fewer number of DBR layers.

6 Claims, 6 Drawing Sheets

INCREASE VCSEL POWER USING MULTIPLE GAIN LAYERS

CROSS REFERENCE TO RELATED APPLICATIONS

The present application claims priority from and benefit of U.S. Provisional Patent Application No. 62/831,756 filed on Apr. 10, 2019 and titled "Increase VCSEL Power Using Multiple Gain Layers". The disclosure of the above-identified provisional patent application is incorporated herein by reference.

FIELD OF THE INVENTION

The invention relates to high power VCSEL systems.

BACKGROUND OF THE INVENTION

Laser diodes started in the 60's in the form of edge-emitting devices. Later, in the 70's, surface emitting devices emerged as an alternative and came to be known as VCSEL (vertical cavity surface emitting lasers). Compared to edge-emitting devices, VCSEL has advantages in terms of fabrication (higher yield), beam profile (circular beams), wavelength variability (across cells), and packaging (easier attachment to heat sink), etc.

A VCSEL chip consists of a 2-D array of emitter cells, spreading over the chip surface. Each cell is independent from its neighbor (no field couplings). Power from a cell can range from a few mW to a few tens of mW (depending on aperture size of a cell). A chip can accommodate thousands of cells (chip dimension a few mm, cell dimension a few um to tens of um). Commercial high power VCSEL chips now offer hundreds of watt (e.g. chip size 5 mm×5 mm, power per unit chip area 1 kW/cm^2). These systems seek high power by using larger chips offering more cells, larger cells, or both.

SUMMARY OF THE INVENTION

This invention seeks high power by using an approach different from using larger chips. It describes a method for increasing power by changing from one gain layer per cell (the current technology practice) to multiple gain layers per cell. The method uses the chip thickness (rather than area) for increasing power. In essence, compared to past approaches which utilizes the lateral dimension of a chip (larger chips) for power, this invention opens up the vertical dimension of a chip for power.

The cell structure consists of several gain layers between the DBR mirrors. The gain layers are in parallel electrically with each other, driven with the same voltage and current. The power of a cell is increased in proportion to the number of gain layers within a cell.

DETAILED DESCRIPTION OF THE INVENTION

Cell Structure

Figure 1:
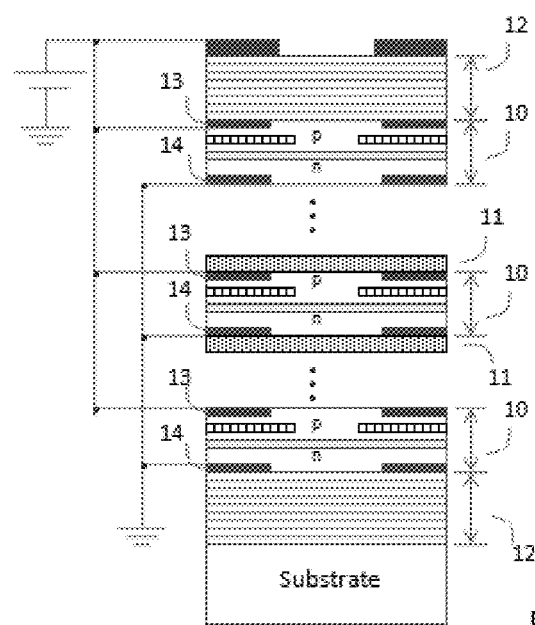
FIG. 1 is a schematic of the cell structure in accordance with the invention.

FIG. 1 shows the cell structure in accordance with the invention. A cell incorporates several gain layers 10 between the DBR mirrors 12. Gain layer are separated from each other through insulated layers 11.

Figure 2:
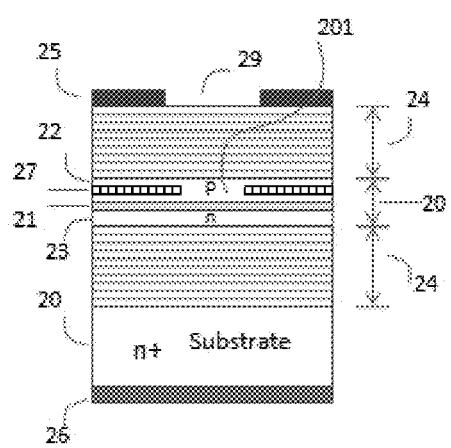
FIG. 2 is a depiction of a typical VCSEL cell structure.

It is useful looking at the structure relative to a VCSEL cell. FIG. 2 shows a typical VCSEL cell structure. It has a gain layer 20, consisting of an active region, a MQW (multiple quantum well) 21, sandwiched between two cladding layers (a p-layer 22 and an n-layer 23). The gain layer is sandwiched between two mirrors 24. The mirrors are DBR (distributed Bragg reflectors) gratings (i.e. quarter-wavelength layers alternating in refractive indices). The chip is connected to a feed current through a ring electrode on top 25 and an electrode at bottom of the chip 26. The current flow is guided by a current blocker 27 near the active region 21. Current flows from the top electrode 25, guided by the current blocker 27, through the active region 21, to the bottom electrode 26. Each chip is a few tens of microns in thickness, mainly from the substrate. The DBR layers are a few microns. The gain layers (cladding and active layers) take less than 1 micron in thicknesses.

Light bounces back and forth between the DBR mirrors 24 and escape through the opening on top 29. The reflectivity of the mirrors are high, typically in the range 99.5~99.9%, matching to the very short gain length (the active region thickness, less than 0.1 micron). The active region transverse size, also the beam size, is defined by the opening 201 of the current blocker 27. The opening must be kept small, comparable to wavelength (micron range), in order to keep wave limited to a single transverse mode. But the small transverse size also limits power.

Increasing power requires more gain volume. The transverse size is the current blocker 27 opening 201, limited to few micron at most by the need of a single mode. The longitudinal size is the MQW 21 thickness, limited to 0.1 micron or less by fabrication (lattice mismatch limits thickness).

FIG. 1 shows the cell structure of the invention. It incorporates several gain layers 10. Within each gain layer, the structure remains similar to that of a standard VCSEL cell, in terms of the active region 21, two cladding layers 22 23, a current blocker 27, etc, as shown in FIG. 2.

However, as shown in FIG. 1, the electrodes are now embedded within the cladding layers (as opposed to the chip top and bottom in a VCSEL). A positive electrode 13 is embedded in the p-layer, and a negative electrode 14 in the p-layer. The electrodes are connected through via (as in IC) to the outside electrodes. The gain layers are separated from each other by an insulating layer 11. The gain layers 10 are in parallel electrically, driven with the same voltage and current.

Reduced DBR Thickness

The increased gain reduces DBR reflectivity (typically 99.5-99.9% for standard VCSEL) needed for lasing threshold. For example, a 10-fold increase in gain (from 10 gain layers) reduces the reflectivity of each DBR mirror from nearly 100% to 32% (square root of 10. (This means a substantial reduction in the number of DBR layers needed for a device.

Power Increase

The lasing wave now experiences gain multiple times in one trip between the mirrors. The power can be expected to increase linearly with the number of gain layers. For example, a 10-layer device would result in 10-times power as a 1-layer device.

Reduced Resistive Loss and Higher Device Speed

Figure 3:
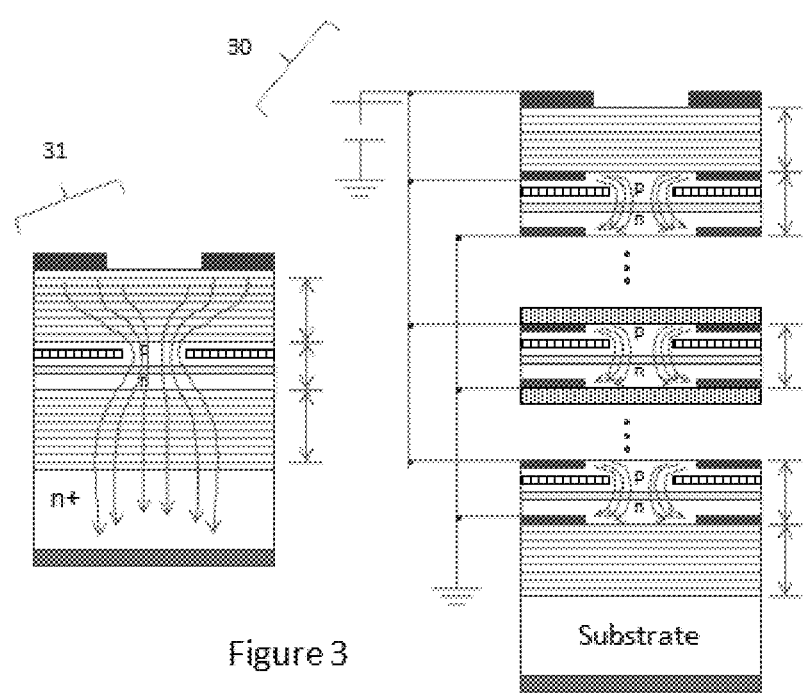
FIG. 3 is a comparison of current flow, current cell vs. VCSEL cell

FIG. 3 shows the current flow within the current cell 30 vs. a VCSEL cell 31. The embedded electrodes do away with current flow through the bottom substrate and DBR layers and thus reduce resistive loss. A lower resistive loss reduces thermal waste. In addition, a lower resistive loss increases device speed (from a lower RC).

Increased Beam Quality

Figure 4:
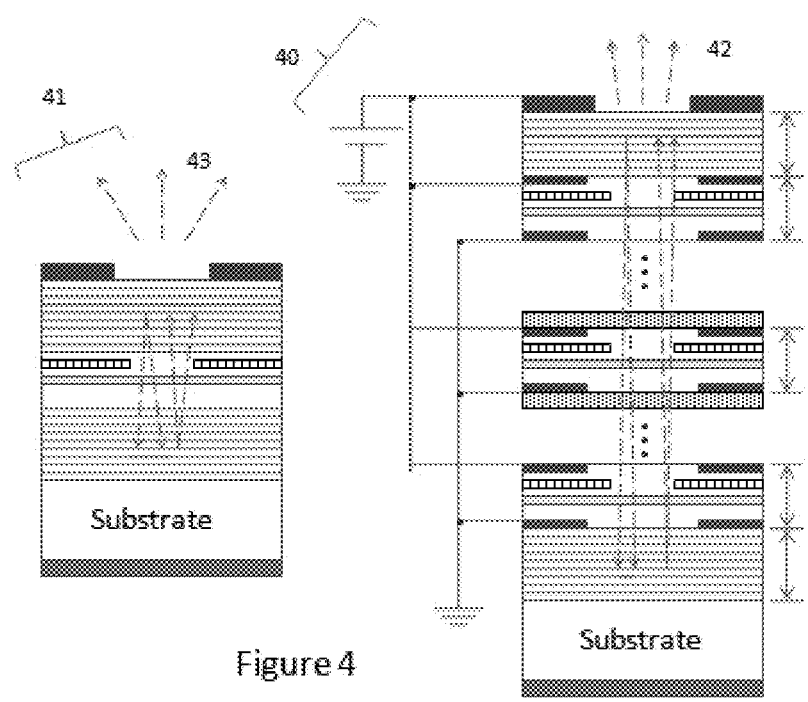
FIG. 4 is a comparison of wave guiding, current cell vs. VCSEL cell

FIG. 4 shows wave guiding with the current cell 40 vs. a VCSEL cell 41. With multiple gain layers, the wave is guided by several apertures (as opposed to a single aperture). The enhanced wave guiding will result in a smaller angular spread 42 of the wave direction, compared to that 43 of the VCSEL cell. The sharper (in angular spread) beam 42 carries an improved beam quality.

In comparison, the approach of increasing power by enlarging the lateral dimension (i.e. larger aperture, by opening up the circuit blocker) will result in reduced beam guiding (more lateral modes) and a lower beam quality.

Fabrication

Figure 5:
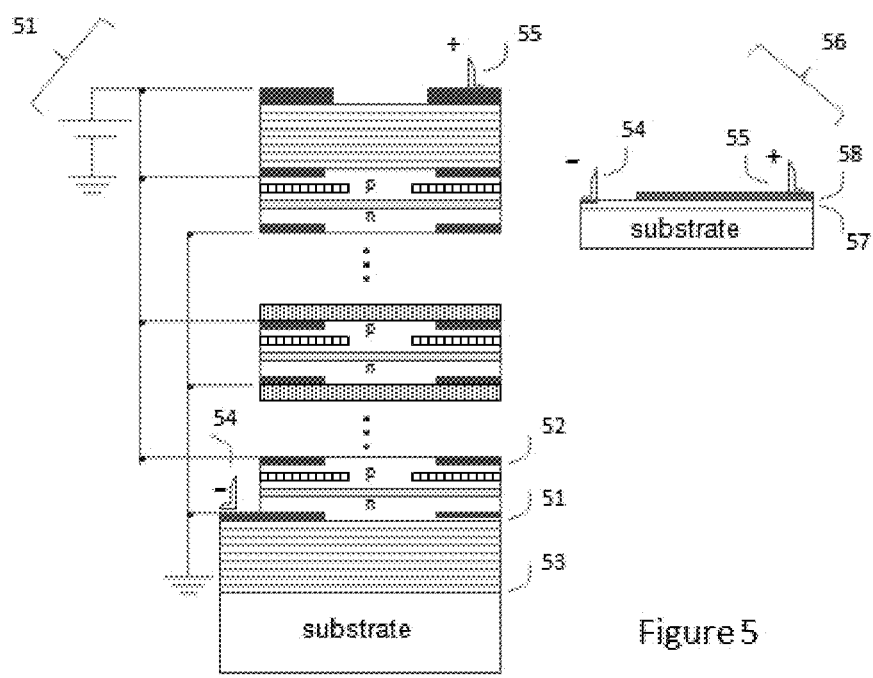
FIG. 5 is a depiction of electrode connections

FIG. 5 shows electrode arrangement with the current cell structure 50. Layer growth starts from the wafer surface 53 to cover the lower DBR mirror first. After that, the growth continues onto the gain layers, starting with the negative via layer 51 at the bottom of the lowest gain layer. The growth from that point on can cover a portion of a die, leaving room on the side of a die for connection to the negative electrode 54. The growth covers the first gain layer, reaching the point 52 where the positive via starts. The growth continues to cover the rest of the gain layers. From the top of the last gain layer, the growth continues to cover the upper DBR mirror. From that point on, the growth can cover a further smaller portion of the die, leaving room for connection to a positive electrode 55 on the side of a die. A more proportionate drawing 56 shows the substrate and the growth layers, consisting of the lower DBR 57, the gain layers 58, and the upper DBR 59, with electrode connections 54 and 55 on the side of a die.

Figure 6:
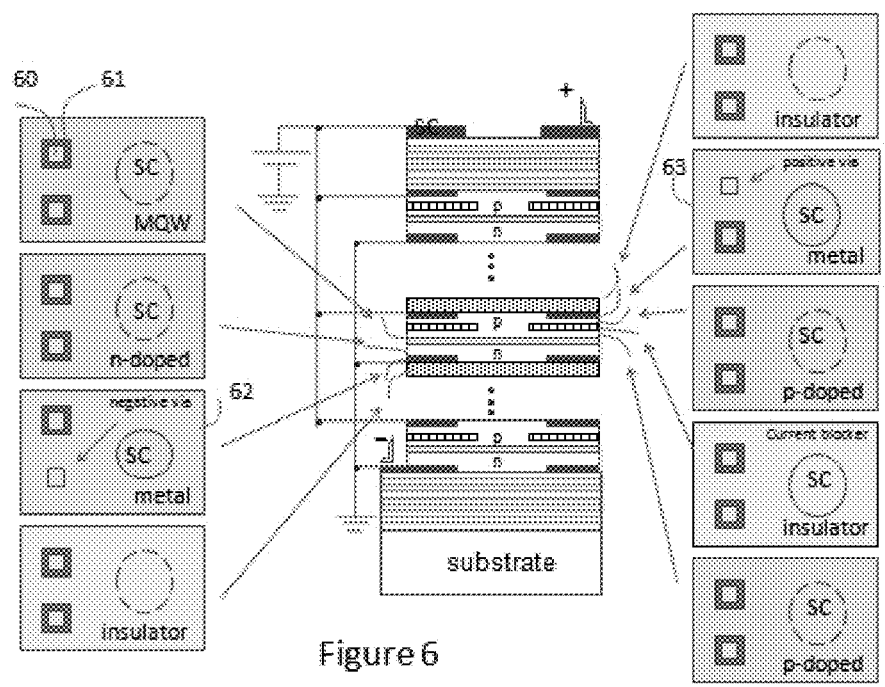
FIG. 6 is a depiction of the layer growth and layer layout

FIG. 6 shows the fabrication layout diagrams for the various layers within a gain layer. Each layer incorporates features for accommodating two via holes. Each via hole 60 is surrounded by insulator material 61. For the two metal layers 62 and 63 accommodating electrodes, only one via hole is insulated from the metal.

Summary

This invention opens up the chip thickness for increasing VCSEL power. Compared to conventional VCSEL, the structure leads to increased power, lower resistive loss, higher device speed, and higher beam quality. Further, the structure requires fewer number of DBR layers. The price to pay is a more elaborate fabrication process for building in two via holes (positive and negative electrodes) through the gain layers.

The invention claimed is:

1. A laser system configured to generate first light at an operational wavelength, the laser system comprising:
    an optical cavity having an optical axis;
    multiple individual light amplifying medium (LAM) disposed coaxially with said optical axis inside the optical cavity,
    wherein said multiple LAM are separated from one another by an insulating layer,
    wherein the LAM are bounded on top and bottom by DBR mirrors,
    wherein each of the LAM has a corresponding gain region;
    wherein each of the LAM gain region is excited by two electrodes,
    wherein the electrodes are connected in parallel.

2. The laser system according to claim 1, wherein said the optical region contains an active layer, with a current blocker nearby for confining current flow near the center of the active region.

3. The laser system according to claim 1, wherein the insulator between gain regions confine current within each gain region, with reduced resistive loss and higher device speed.

4. The laser system according to claim 1, wherein wave guiding takes place through multiple gain regions for enhanced beam quality.

5. The laser system according to claim 1, wherein the gain region electrodes are connected in parallel through via built during chip fabrication.

6. The laser system according to claim 1, wherein the number of DBR layers are reduced by the increase in gain.

* * * * *